July 4, 1961 E. WOLFENDALE 2,991,424

MEANS FOR COMPENSATING ELECTRIC CIRCUIT ARRANGEMENTS IN RELATION TO EXTERNAL CONDITIONS

Filed Aug. 29, 1955

INVENTOR
ERIC WOLFENDALE
BY [signature]
AGENT

United States Patent Office 2,991,424

Patented July 4, 1961

2,991,424

MEANS FOR COMPENSATING ELECTRIC CIRCUIT ARRANGEMENTS IN RELATION TO EXTERNAL CONDITIONS

Eric Wolfendale, Horley, England, assignor, by mesne assignments, to North American Philips Company, Inc., New York, N.Y., a corporation of Delaware Filed Aug. 29, 1955, Ser. No. 530,974

Claims priority, application England Sept. 20, 1954

6 Claims. (Cl. 330—40)

This invention relates to means for compensating electric circuit arrangements in relation to external or ambient conditions such as temperature.

The invention relates more particularly to compensating means for use with transistor circuits. The need for such compensation may be illustrated by a specific example: a junction transistor has a collector current at zero emitter current, hereinafter referred to as the cut-off current ($I_{co}$), which is an exponential function of temperature. Moreover, the value of the cut-off current $I_{co}$ varies from one transistor to another. These facts make the use of transistors as D.C. amplifiers difficult unless a good method of stabilization is found. Fortunately, the law of temperature dependence is the same for all transistors of the same type.

According to one aspect of the invention, a circuit arrangement comprises an amplifier circuit employing at least one amplifier transistor having characteristics a constant of which is dependent on temperature, and a compensating circuit employing an additional or compensating transistor which is arranged solely to compensate the effects of temperature on the amplifier transistor.

According to a further aspect of the invention, a circuit arrangement comprises at least one amplifier transistor having a cut-off current which is dependent upon temperature, another or compensating transistor having a cut-off current dependent upon temperature in a similar manner, and means whereby the collector or emitter current of said compensating transistor is caused to influence the base current of the amplifier or compensated transistor in such manner as to render the amplifier transistor substantially independent of temperature.

Several amplifier transistors of similar characteristics may be employed in cascade or otherwise with common temperature compensation by a single compensating transistor.

Preferably, the base current of one or more compensated transistors, or a compensating component thereof, is a current directly controlled by or derived from the collector current of the compensating transistor. Preferably also, junction transistors are used and the compensating transistor is preferably so arranged that its actual collector current is substantially proportional to the value of its cut-off current $I_{co}$. Such proportionality may be achieved, as explained hereinafter, by open circuiting the base of the compensating transistor.

The compensated transistor or transistors may be employed for A.C. or D.C. amplifying, although the advantages of the invention are attained most fully in D.C. amplifier applications.

In order that the invention may be readily carried into effect, preferred embodiments thereof, as applied to the temperature compensation of junction transistors, will now be described by way of example with reference to the accompanying drawing, wherein.

Figure 1:
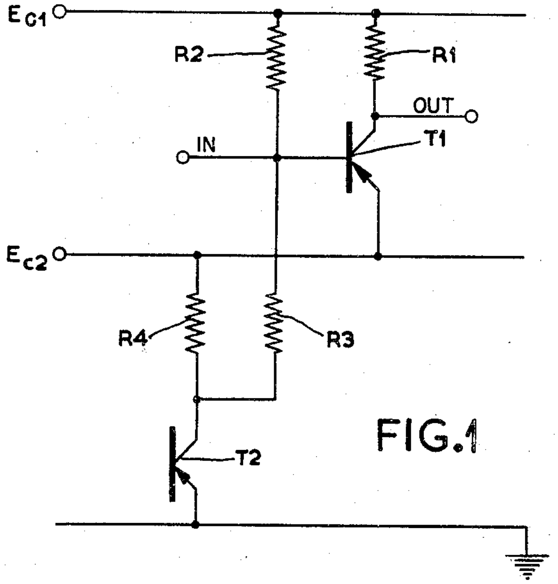
FIG. 1 is a schematic diagram of an embodiment of the circuit arrangement of the present invention.

Referring now to FIGURE 1, a P-N-P transistor T1, which may be employed for D.C. amplification, is connected in a grounded emitter circuit with a collector load R1 and negative voltage supply $E_{c1}$, and its collector current is a function of its cut-off current $I_{co1}$ which is temperature dependent.

A compensating P-N-P transistor T2 is also provided in a grounded emitter circuit wtih a separate voltage supply $E_{c2}$, and the collector current of this transistor is also temperature dependent. Transistor T2 is provided with a collector load R4 which takes a fraction of the collector current, the remaining fraction being taken to the base circuit of transistor T1 through a resistor R3. The base of transistor T2 is open-circuited and the arrangement is such that a fraction of the collector current of transistor T2, which is temperature dependent, is fed into the base of transistor T1 and this current effectively opposes the component of the collector current of transistor T1 which is dependent on the cut-off current $I_{co1}$ of transistor T1. Thus, if the temperature varies, the collector current of transistor T1 will remain substantially unaffected.

The operation of the circuit will now be described in greater detail.

Without temperature compensation, the collector current of transistor T1 would be determined according to the well-known grounded-emitter equation $$(a) \qquad I_{c1}=\alpha'_1 I_{b1}+(\alpha'_1+1)I_{co1}$$

and would thus contain a nominally constant but temperature-dependent term proportional to $I_{co1}$ ($I_{b1}$ is the base current of transistor T1 which may contain a varying D.C. input to be amplified as shown, and $\alpha'_1$ is the base-collector current gain of transistor T1).

Therefore the stabilization problem can be solved by introducing a term proportional to $I_{co1}$ which is quantitatively equal and opposite in sign to $(\alpha'_1+1)I_{co1}$. This may be done by feeding a suitable component into the base of transistor T1. This component is obtained in the present arrangement from the collector of transistor T2, which is coupled, as shown, to the base circuit of transistor T1.

For this purpose the actual collector current $I_{c2}$ of transistor T2 is rendered proportional to its cut-off current $I_{co2}$, and this is done by open-circuiting the base. This will be understood by reference to Equation $a$ as applied to transistor T2. In such equation the base currents term will disappear, leaving $$(b) \qquad I_{c2}=(\alpha'_2+1)I_{co2}$$

A fraction of this current $I_{c2}$ can be fed into the base of transistor T1, in addition to the existing base current $I_{b1}$, in such manner as to provide the desired compensating component in the collector circuit thereof. More particularly, if we assume that said fraction is Y then Equation ($a$) becomes $$(c) \qquad I_{c1}=\alpha'_1 I_{b1}+(\alpha'_1+1)I_{co1}-\alpha'_1 Y(\alpha'_2+1)\ I_{co2}$$

Assuming, in the ideal case, that $\alpha'_1=\alpha'_2$ and $I_{co1}=I_{co2}$ due to the similar characteristics of the two transistors, it will be seen that the two temperature-dependent terms cancel out when Y is adjusted, e.g. by variation of resistor R3, and/or resistor R4, to a value equal to $1/\alpha'$. However, more or less exact compensation can be obtained by adjustment of the value Y also in the more practical case of transistors T1 and T2 which, though of the same type, are unmatched or only imperfectly matched. Therefore the compensating effect can be accurately adjusted and can be effected to any desired extent, including over- and under-compensation. Thus for example the over-all temperature-dependent characteristic of a multi-stage D.C. transistor amplifier may be compensated substantially exactly by the action of a single compensating transistor acting on the first transistor stage of the amplifier.

Figure 2:
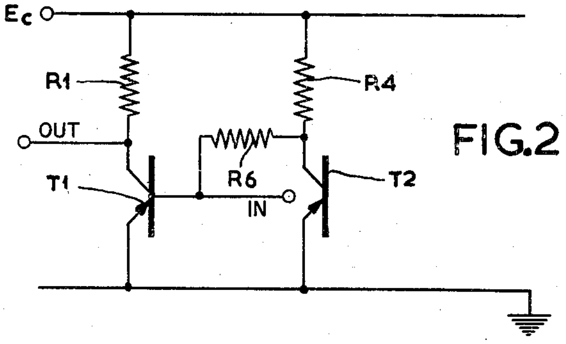
FIG. 2 is a schematic diagram of another embodiment of the circuit arrangement of the present invention.

It is possible for the compensating transistor T2 to supply the whole of the base current of the compensated transistor T1, but such an arrangement is more limited in its application than the circuit arrangement of FIG. 1, since the current can no longer be reversed in direction as is possible with the circuit of FIGURE 1. As a result the compensated transistor T1 cannot be worked in its low current region. An example of such a circuit is shown in FIGURE 2 in which like components have the same reference numerals as in FIGURE 1. Compensated and compensating junction transistors T1 and T2 have collector loads R1 and R4 respectively. It is possible in this case for such loads to be connected, as shown, to a common negative voltage supply $E_c$. The entire base current of transistor T1 is supplied from the collector of transistor T2 through a resistance R6.

In the arrangements of FIGURES 1 and 2 the transistors to be compensated are in grounded-emitter circuits, and it is in such circuits that the invention is most advantageous since, as is seen from Equation *a*, the current component to be neutralized is $(\alpha'+1)$ times $I_{co}$. However, the invention may also be advantageous in grounded-base circuits, e.g. where large temperature changes arise, in spite of the fact that in such circuits the temperature-dependent component is only $I_{co}$ instead of $(\alpha'+1)\ I_{co}$, as shown by the known grounded-base Equation *d*

$$I_c=\alpha I_e+I_{co}$$

Figure 3:
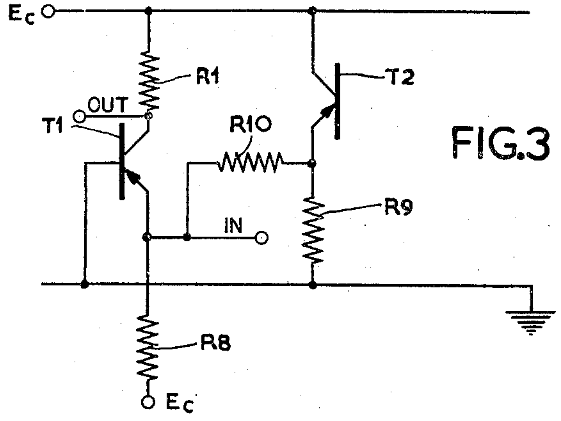
FIG. 3 is a schematic diagram of still another embodiment of the circuit arrangement of the present invention.

An example of such an arrangement is shown in FIGURE 3, in which the emitter-base circuit of the compensated transistor T1 is supplied in part from a positive voltage supply $E_e$ through a resistance R8, and in part from the emitter circuit (not the collector circuit as in FIGURES 1 and 2) of a transistor T2 through a resistance R10, the transistor T2 being provided with an emitter load R9.

What is claimed is:

1. A circuit arrangement comprising a first transistor having emitter and base electrodes defining an amplifier input electrode system and a collector electrode defining with one of said input electrodes an amplifier output circuit, and means for compensating temperature variations in the value of the emitter-collector cut off current of said transistor, said means comprising a second transistor having emitter and collector electrodes defining an internal emitter-collector path, means for connecting the emitter-collector path of said second transistor in series with a source of bias voltage in the base-emitter circuit of said first transistor, said second transistor operating with open base circuit and zero base current, and said source being of a polarity such that the collector electrode of said second transistor and said input electrode system of said first transistor are biased in the reverse direction.

2. A circuit arrangement as claimed in claim 1, wherein the said second transistor exhibits an emitter-collector cut off current characteristic in response to temperature variations substantially similar to the emitter-collector cut off current of said first transistor.

3. A circuit arrangement comprising a first transistor having emitter and base electrodes defining an amplifier input electrode system and a collector electrode defining with one of said input electrodes an amplifier output circuit, and means for compensating temperature variations in the value of the emitter-collector cut off current of said first transistor, said means comprising a second transistor having emitter and collector electrodes defining an internal emitter-collector path and an open-circuited base electrode for producing a collector current substantially equal to the value of its cut off current, means for connecting the emitter-collector path of said second transistor in series with a source of bias voltage in the base-emitter circuit of said first transistor, said source being of a polarity such that the collector electrode of said second transistor and said input electrode system of said first transistor are biased in the reverse direction.

4. A circuit arrangement comprising a first transistor having emitter and base electrodes defining an amplifier input electrode system and a collector electrode defining with one of said electrodes an amplifier output circuit, and means for compensating temperature variations in the value of the emitter-collector cut off current of said first transistor, said means comprising a second transistor having emitter and collector electrodes defining an internal emitter-collector path and an open-circuited base electrode for producing a collector current substantially equal to the value of its cut off current, resistive means for said emitter-collector path connecting in series with a source of bias voltage biasing said collector electrode in the reverse direction, and resistive means for connecting the said emitter-collector path of said second transistor in the base-emitter circuit of said first transistor, said source of bias voltage being of a polarity such that said input electrode system of said first transistor is biased in the reverse direction.

5. A circuit arrangement as claimed in claim 4, wherein the base electrode of said first transistor is resistively connected to the collector electrode of said second transistor.

6. A circuit arrangement as claimed in claim 4, wherein the emitter electrode of said first transistor is resistively connected to the emitter electrode of said second transistor.

References Cited in the file of this patent

Shea text, "Principles of Transistor Circuits," pages 168–181, pub. 1953, by John Wiley Sons, Inc., N.Y.C.